United States Patent [19]
Scott

[11] Patent Number: 5,594,751
[45] Date of Patent: Jan. 14, 1997

[54] CURRENT-APERTURED VERTICAL CAVITY LASER

[75] Inventor: Jeffrey W. Scott, Carpinteria, Calif.

[73] Assignee: Optical Concepts, Inc., Lompoc, Calif.

[21] Appl. No.: 494,823

[22] Filed: Jun. 26, 1995

[51] Int. Cl.$^6$ ................................................ H01S 3/19
[52] U.S. Cl. .............................. 372/46; 372/45; 372/92; 372/96
[58] Field of Search ................................ 372/46, 45, 92, 372/96

[56] References Cited

U.S. PATENT DOCUMENTS

| | | | |
|---|---|---|---|
| 5,343,487 | 8/1994 | Scott et al. | 372/46 |
| 5,412,680 | 5/1995 | Swirhun et al. | 372/45 |
| 5,457,328 | 10/1995 | Ishimatsu et al. | 327/50 X |
| 5,493,577 | 2/1996 | Choquette et al. | 372/46 |

OTHER PUBLICATIONS

Hayshi et al., "A Record Low Threshold Index-Guided InGaAs/GaAlAs Vertical-Cavity Surface-Emitting Laser with a Native Oxide Confinement Structure", date unknown, Tokyo Institute of Technology, Precision and Intelligence Laboratory. (No Date).

Hadley et al., "Comprehensive Numerical Modeling of Vertical-Cavity Surface-Emitting Lasers", date unknown.

MacDougal et al., "Ultralow Threshold Current Vertical-Cavity Surface-Emitting Lasers with AlAs Oxide-GaAs Distributed Bragg Reflectors", IEEE Photonics Technology Letters, vol. 7, No. 3, Mar. 1995.

*Primary Examiner*—James W. Davie
*Attorney, Agent, or Firm*—Victor M. Genco, Jr.

[57] ABSTRACT

A vertical-cavity surface-emitting laser (VCSEL) has an active region, first and second mirror stacks forming a resonant cavity with a radial variation in index forming a transverse optical mode, and a thin insulating slot within the cavity to constrict the current to a diameter less than the beam waist of the optical mode thereby improving device efficiency and preferentially supporting single mode operation. In one embodiment, an insulating slot is formed by etching or selectively oxidizing a thin aluminum-containing semiconductor layer in towards the center of a cylindrical mesa. The slot thickness is sufficiently thin that the large index discontinuity has little effect on the transverse optical-mode pattern. The slot may be placed near an axial standing-wave null to minimize the perturbation of the index discontinuity and allow the use of thicker slots. In a preferred embodiment, the current constriction, formed by the insulating slot, is located on the p-type side of the active region and has a diameter significantly less than the beam waist of the optical mode, thus minimizing outward diffusion of carriers and ensuring single transverse-mode operation of the laser by suppressing spatial hole burning.

24 Claims, 9 Drawing Sheets

CURRENT-APERTURED VERTICAL CAVITY LASER

BACKGROUND OF THE INVENTION

This invention relates to semiconductor vertical-cavity surface-emitting lasers (VCSELs), and more particularly to structures and techniques for providing highly-efficient and single-mode VCSELs. A VCSEL is a semiconductor laser consisting of a semiconductor layer of optically active material, such as gallium arsenide or indium gallium arsenide or the like, sandwiched between highly-reflective layers of metallic material, dielectric material, epitaxially-grown semiconductor dielectric material or combinations thereof, most frequently in stacks known as distributed Bragg reflectors. As is conventional, one of the mirror stacks is partially reflective so as to pass a portion of the coherent light built up in the resonating cavity formed by the mirror stack/active layer sandwich.

Laser structures always require optical confinement and carrier confinement to achieve efficient conversion of pumping electrons to stimulated photons. Carrier confinement is generally achieved by varying the resistivity of the materials between the electrical contacts and the active region. Such techniques include introduction of high resistivity through ion bombardment, variations in doping and dopant type, removal of conductive material by etching as well as conversion of semiconductor into insulating oxide by selective oxidation. Optical confinement is achieved by varying the index of refraction of the materials in the structure. It is convenient to discuss the cavity in terms of a cylindrical geometry, although many cross sections are possible and the invention is not limited to cylindrical geometries. The axial mode's standing-wave pattern in a VCSEL is very strong due to the high reflectivity of the mirrors, typically in excess of 99%. The relatively short optical path length between the two mirrors results in a relatively large wavelength separation between resonant axial modes. The large wavelength separation ensures that the VCSEL lases in only a single axial mode. The transverse or radial optical mode's intensity profile is determined by radial index variations in the cavity. A desirable mode is the fundamental mode, for example the $HE_{11}$ mode of a cylindrical waveguide. A fundamental mode signal from a VCSEL is easy to couple into an optical fiber, has low divergence, maintains a stable far field pattern and is inherently single frequency in operation.

VCSELs which introduce radial index variations for optical confinement are known as index-guided VCSELs. In a conventional edge-emitting semiconductor laser, the transverse index guide (perpendicular to the growth direction) is designed for an index variation on the order of 0.1% to achieve single transverse mode operation. The small index variation precludes the existence of higher order transverse modes. Regrown or ridge waveguide structures are typically used in edge-emitting lasers to form the transverse index guide. In order for a VCSEL to lase, the mirror reflectivities in the axial direction must be very high and thus the layers must be epitaxially grown or deposited with a high degree of planarity. The requirement of high planarity has precluded the effective use of regrowth or ridge waveguide designs in VCSELs.

The previously-known index guided VCSELs use either etched-post or insulating slots to provide carrier confinement and introduce a radial index variation. Unfortunately, the radial index variation is relatively large and results in a cavity which supports multiple transverse modes. Furthermore, the carrier confinement is generally at a diameter equal to or larger than the transverse optical-mode diameter. As the optical mode is weak at the edges, conversion of the carriers into light by stimulated emission is reduced substantially for those carriers in the active region outside the characteristic diameter (or beam waist) of the transverse optical mode.

What is needed is a VCSEL structure that provides carrier confinement to a diameter less than that of the transverse optical mode and yet can be realized while maintaining a high degree of planarity in the layers. In co-assigned U.S. Pat. No. 5,343,487, the inventors disclosed a VCSEL that provided a constriction of carriers to an aperture less than the transverse optical mode. The disclosed laser used a ring-contact geometry so that ion implantation or diffusion techniques could be used to alter the conductivity of a semiconductor layer, providing a current constriction without introducing an optical constriction. The earlier patent also disclosed a resistive current-leveling layer between the active region and the conductive layer to minimize current-crowding effects associated with ring-contacted junctions. The drawbacks of this laser are the complexity of fabricating a ring-contacted geometry and the difficulties of using the semiconductor altering techniques, such as ion implantation and diffusion, that do not introduce significant refractive-index discontinuities.

It would be highly desirable to be able to introduce a current constriction with technologically-simpler techniques that introduce refractive-index discontinuities without constricting the transverse optical mode as well. The present invention allows such simpler techniques for current construction to be used without constricting the optical mode, and therefore the present invention has broad applicability to a wide variety of VCSEL structures.

SUMMARY OF THE INVENTION

According to the invention, in a vertical-cavity surface-emitting laser (VCSEL) with an active region, first and second mirror stacks forming a resonant cavity, and a radially-varying index profile which defines the transverse mode, an electrically insulating slot (or slots) is introduced within the cavity to constrict the current to a diameter less than the beam waist of the optical mode. According to the invention, the insulating slot is designed to be so thin that the effective index discontinuity does not constrict the optical mode. In a preferred embodiment, the insulating slot is placed near a null in the axial mode's standing-wave pattern allowing for thicker slots without constricting the optical mode.

The invention will be better understood upon reference to the detailed description in connection with the accompanying drawings.

BRIEF DESCRIPTION OF THE DRAWINGS

FIG. 15 shows the modal gains for the unimproved device. FIG. 16 shows the modal gains for the device according to the invention.

DETAILED DESCRIPTION OF THE SPECIFIC EMBODIMENTS

Figure 1:
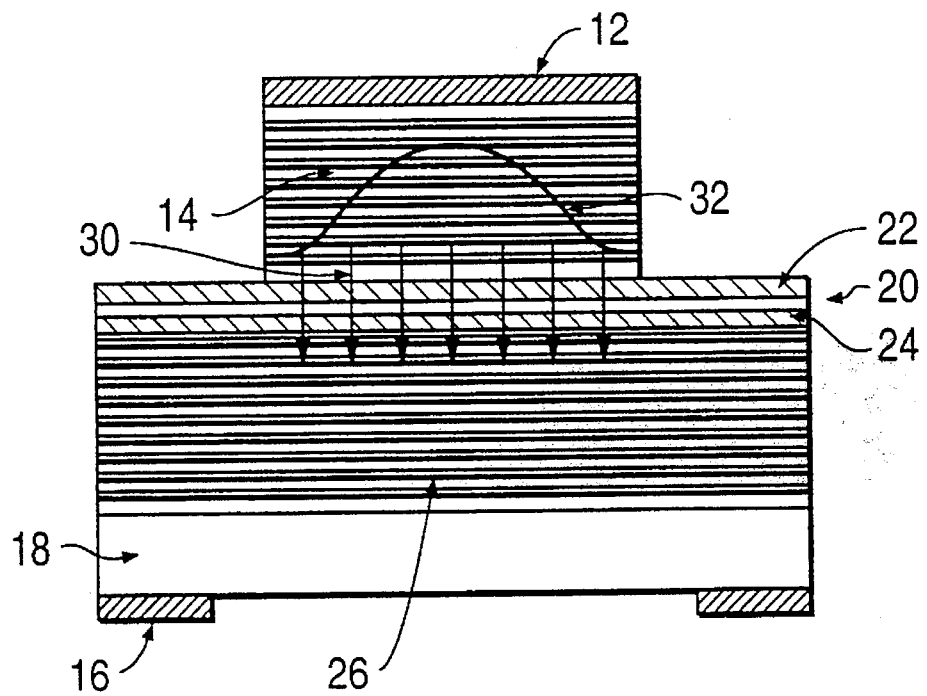
FIG. 1 is a side cross-sectional view of a prior art Vertical-Cavity Surface-Emitting Laser (VCSEL) illustrating the transverse optical mode and current flow.
Figure 2:
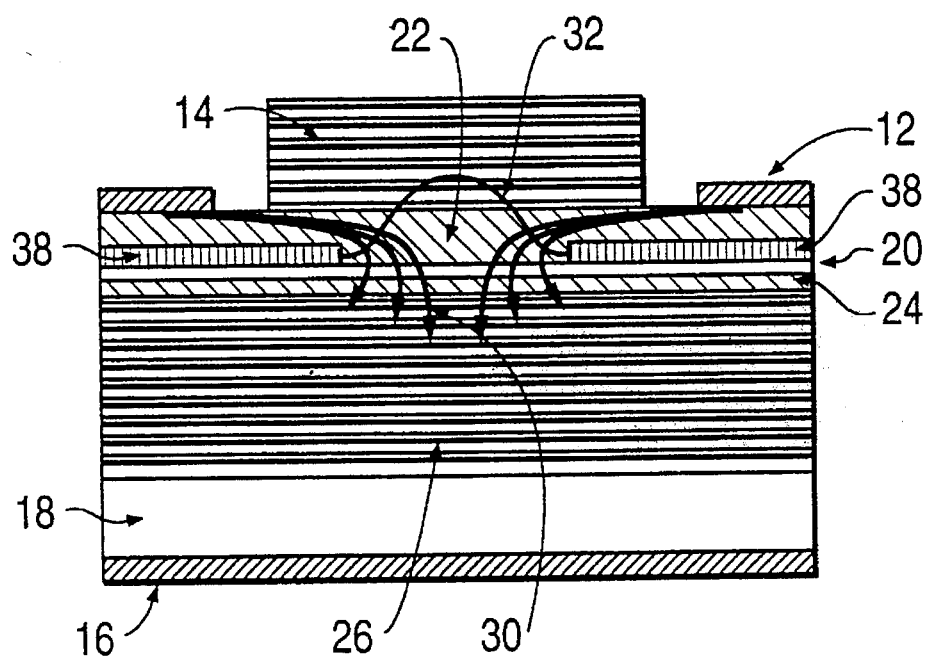
FIG. 2 is a side cross-sectional view of a different prior art VCSEL illustrating the transverse optical mode and current flow.
Figure 3:
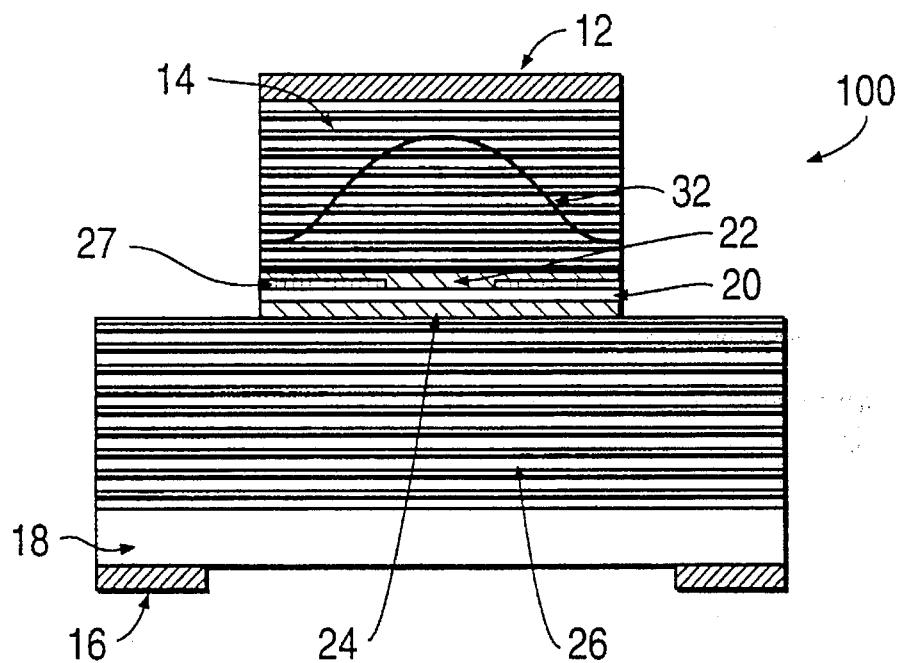
FIG. 3 is a side cross-sectional view of a VCSEL according to the invention, illustrating the transverse optical mode.

Referring to FIG. 3, there is shown a vertical-cavity surface emitting laser device 100 in accordance with a specific embodiment of the invention. The laser device 100 has a first electrode 12 disposed on top of a first mirror stack 14, a second electrode 16 disposed on a semiconductor substrate 18 beneath an active region 20 and a second mirror stack 26 such that the active region, which is formed of a conventional InGaAs multiple quantum well, is contacted on opposing sides by the electrodes 12 and 16. The first mirror stack 14 defines a waveguide cavity which constrains the electromagnetic field and defines the transverse optical mode 32. The axial mode of the electromagnetic field is defined by spacing of the reflective surfaces of the respective mirror stacks and the thicknesses of the active region 20, the first contacting layer 22 and second contacting layer 24. The active region 20 is ideally placed at the maximum in the axial mode's standing wave pattern and any optically-absorptive elements are disposed at nulls in the standing wave pattern, as is understood in the art. The first contacting layer 22 is disposed above the active layer 20 in electrical contact through the mirror stack 14 with the first electrode 12, and a second contacting layer 24 is disposed below the active region in electrical contact through mirror stack 26 with the second electrode 16. For laser operation under electrical excitation, it is required that one of the contacting layers be p-type and that the other be n-type, as is understood in the art.

Figure 4:
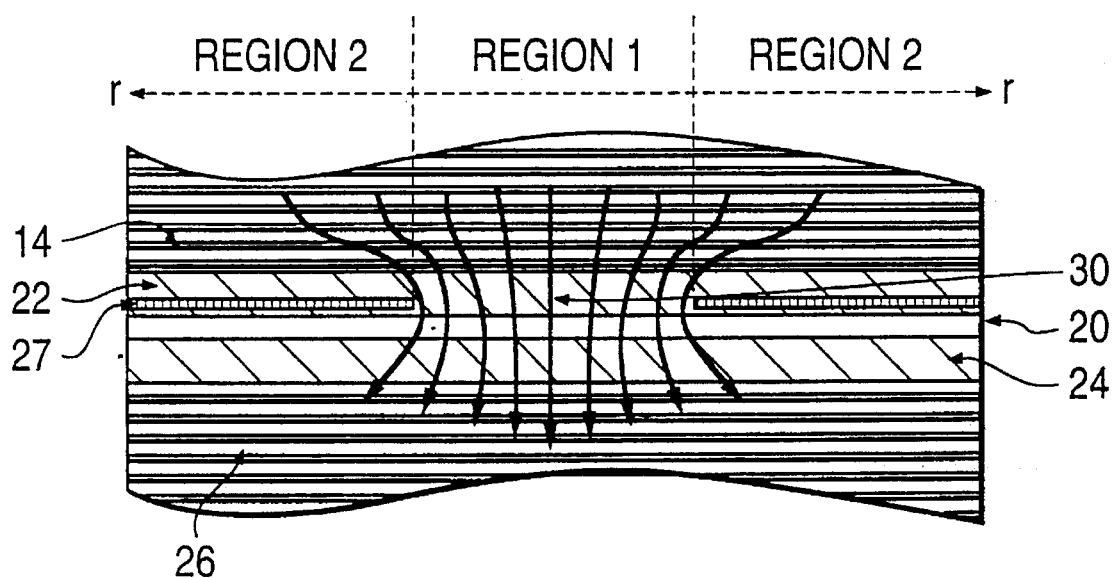
FIG. 4 is a detail side cross-sectional view of the device of FIG. 3 illustrating the current flow.

FIG. 4 shows the process whereby the current 30 is forced in towards the center of the cavity by an insulating slot 27. According to the invention, the thickness of slot 27 is sufficiently thin that the transverse optical mode 32 is not constricted, allowing a larger-diameter transverse optical mode and resulting in more efficient and single transverse-mode operation.

Referring to FIG. 4, an electrically-insulating slot 27 has been formed in the laser cavity which constricts the current to flow within an aperture identified as region 1. The modified cavity outside the constriction is identified as region 2. Electrically-insulating slot 27 could be formed by a selective technique such as wet etching or wet oxidizing a high aluminum containing semiconductor layer as is known in the art. The high aluminum containing layer, such as AlAs, AlGaAs, AlInAsP or the like, is grown within the first contacting layer 22 and exposed by etching a mesa after epitaxial growth. In the InP system, highly selective wet etches exist for InGaAsP. Such techniques usually result in an index of refraction associated with a vacuum or oxide, in the range of 1 to 1.7, replacing the semiconductor index which is usually in the range of 3 to 3.6. Such a large change in index will cause large optical reflections, constrict the transverse optical mode 32 and alter the optical path length between the first mirror stack 14 and the second mirror stack 26. The change in optical path length will manifest itself in a shift in the resonant wavelength of the cavity. This is undesirable and the shift should be minimized to achieve optimal single transverse mode performance. If the thickness of the slot 27 is sufficiently thin, however, the phase of the reflections from the upper and lower interfaces will cancel and the slot will have little effect on the optical properties of the cavity while the current 30 will remain constricted.

Figure 5:
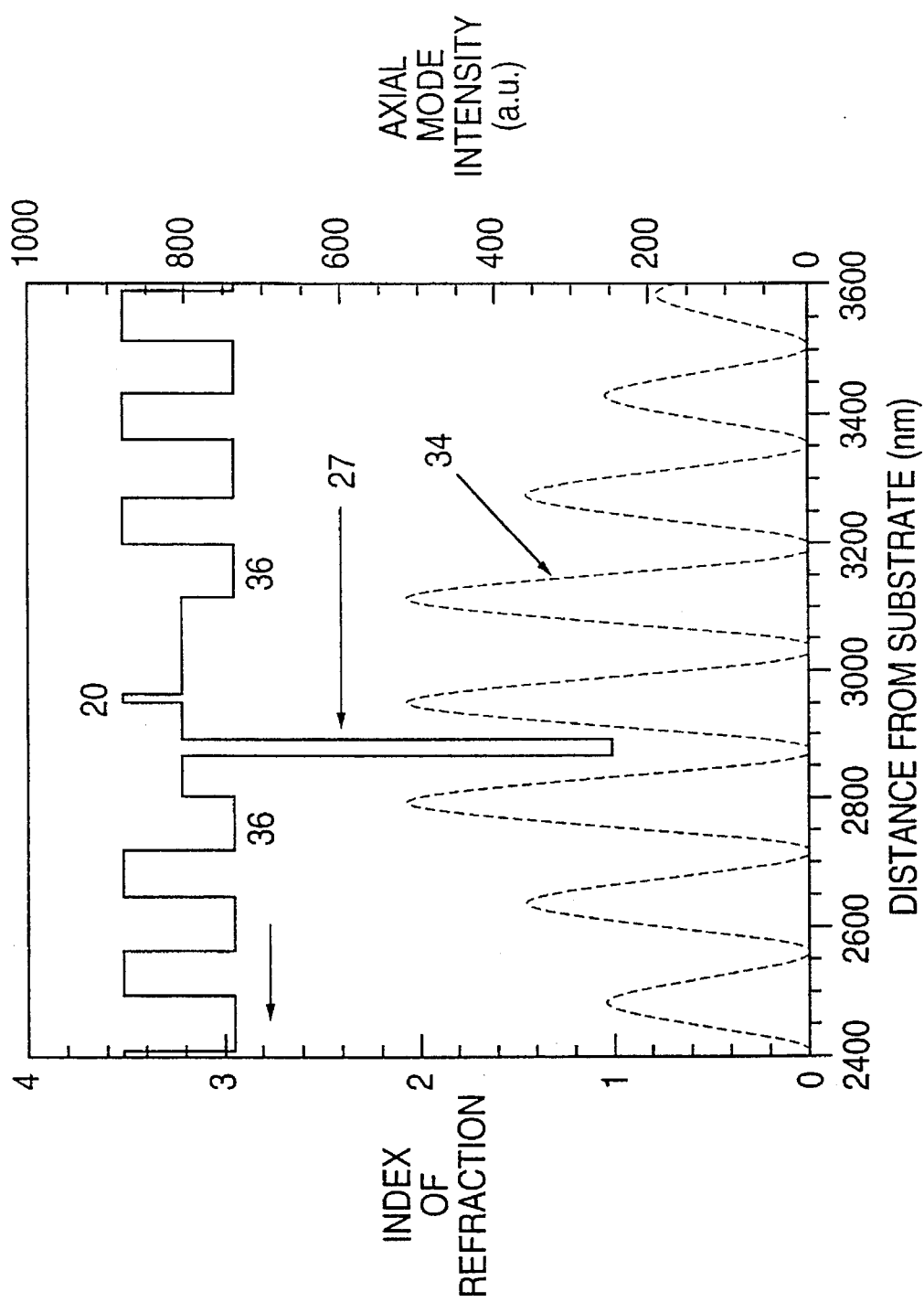
FIG. 5 is a detail axial cross-sectional view of the device of FIG. 3 illustrating the relation between the axial optical mode and the layers.

In the preferred embodiment, the slot is placed near a null in the axial mode's standing wave pattern. Just as the optical losses are minimized by placing the optically lossy materials near an axial standing-wave null, so are the effect of index variations minimized near standing wave nulls. Referring to FIG. 5, the index of refraction and the axial mode's standing wave pattern 34 are shown in the vicinity of the active region 20. The periodic steps in index on either side are the distributed Bragg reflectors, with each layer a quarter of an optical wave in thickness as is standard in the art. The active region 20 shown in FIG. 5 comprises a single 100 Å thick InGaAs quantum well. Many other active regions are possible and are not limited by the invention. The plot corresponds to an axial cross section of region 2 in FIG. 4. The index of refraction of the electrically-insulating slot 27 is set at 1.0 as appropriate for a vacuum. The axial mode is calculated using the transmission matrix technique as known in the art. The slot 27 is centered on a standing wave null and has been chosen to be 300 Å thick for this example. It is apparent that there are many other potential locations and thicknesses for the slot (or slots) which would lie near standing wave nulls. It is preferable to keep the slot 27 close to the active region to minimize the spreading of the current 30 before it is injected into the active region 20. It is also preferable to place the current constricting slot 27 on the p-type side of the active region 20 because of the lower diffusion constant of holes within the active region 20. A lower diffusion constant is preferable because the outward diffusion of carriers counteracts the current constricting effect of the slot 27.

Using the transmission matrix technique, the reflectivity of region 1 and region 2 can be calculated. The inset in FIG.

Figure 6:
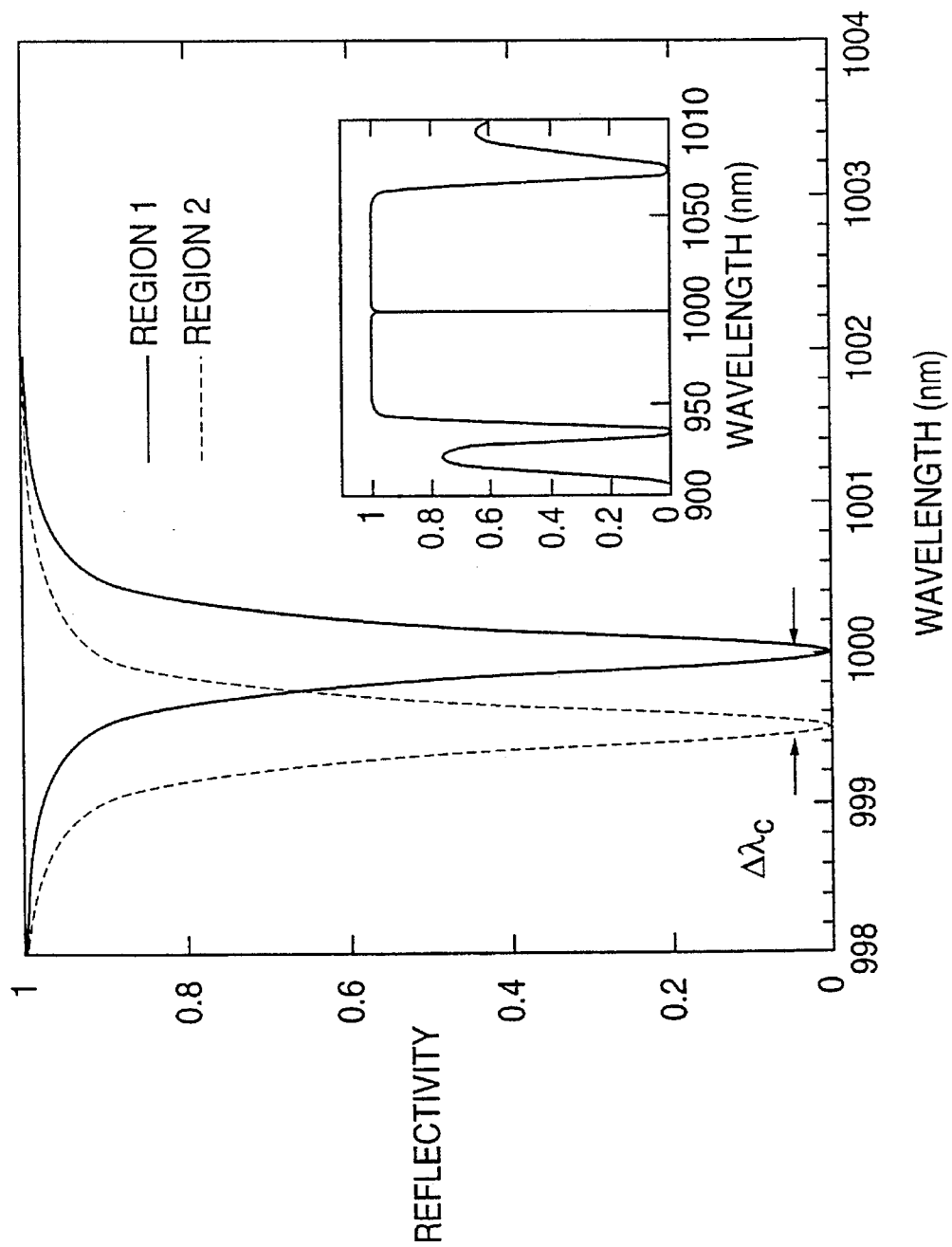
FIG. 6 is the reflectivity spectrum for the two radial regions identified in FIG. 4, showing the respective cavity mode resonances.

6 shows a typical reflectivity spectrum. The distributed Bragg reflectors, 14 and 26, have a limited band of high reflectivity. The resonance near the center is determined by the optical path length in the cavity and specifies the lasing wavelength $\lambda_c$. The larger plot in FIG. 6 shows the detail of the cavity resonances for region 1 and region 2. The two resonances are shifted by an amount are equal to 0.5 nm. In the limit of small shifts, it is known that the transverse optical mode due to index guiding in VCSEL cavities can be calculated using:

$$\frac{\Delta n}{n_{eff}} = \frac{\Delta \lambda_c}{\lambda_c} \quad (1)$$

where $\Delta n$ is the change in effective index between region 1 and region 2 and $n_{eff}$ is the effective index of refraction. Using Eqn. (1) the transverse optical mode can then be calculated once the reflectivity spectra in the two regions are known. The criterion of just how thin the electrically-insulating slot 27 must be can thus be quantified.

Figure 7:
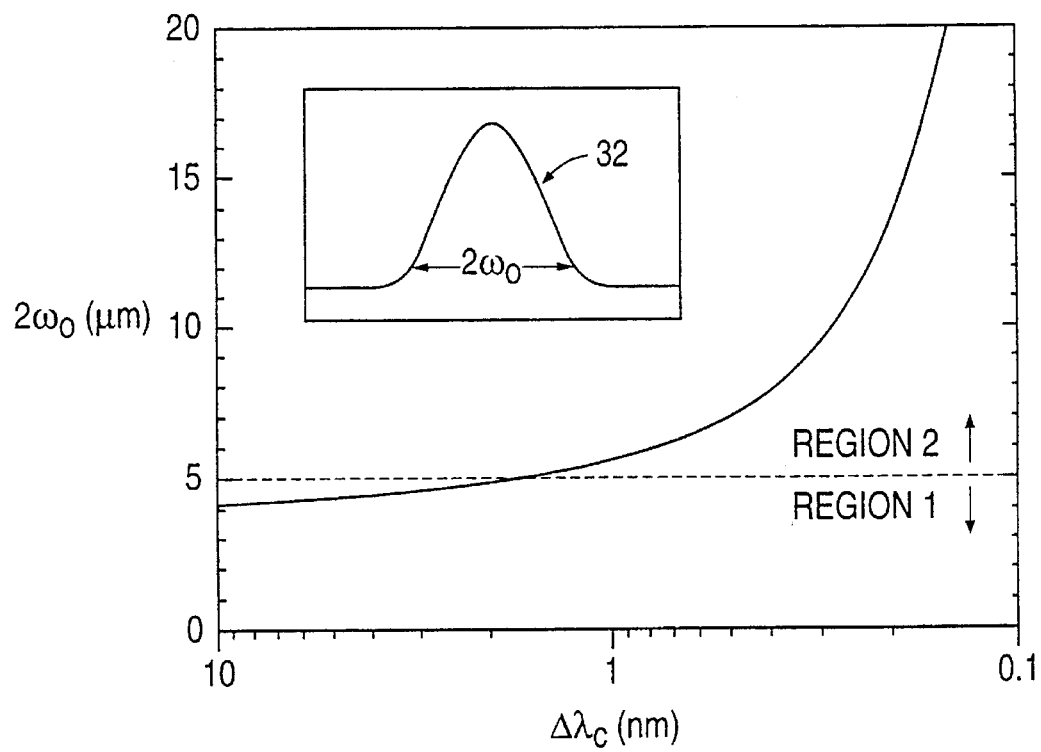
FIG. 7 is a plot of the transverse mode diameter as a function of the shift in axial cavity-mode resonance between the two regions.

The transverse optical modes for a cylindrical waveguide of core index $n_{core}$ and cladding index $n_{clad} = n_{core} - \Delta n$ are known as the HE and EH modes. The fundamental mode is $HE_{11}$ mode. The modes are typically characterized by the radius $\omega_o$ at which the optical intensity has dropped to $(1/e)^2$ or 0.135 times the intensity at the center. The beam diameter $2\omega_o$, also known as the beam waist, is plotted in FIG. 7 as a function of the shift in cavity mode $\Delta\lambda_c$ assuming a core diameter of 5 μm, an effective index $n_{eff}=3.25$ and a cavity resonance $\lambda_c=1000$ nm. A dashed line indicates where the beam waist crosses from region 1 of FIG. 4 to region 2. It is apparent in FIG. 7 that as $\Delta\lambda_c$ becomes less than 1 nm, or 0.1% of $\lambda_c$, the transverse optical mode 32 spreads out quickly. A fractional shift in the axial cavity mode's resonance of less than 0.05% after formation of the slot is desirable for single-mode operation. The preferred embodiment is to use another, larger-diameter index discontinuity to define the transverse optical mode 32 and use Eqn. (1) to ensure that the current constricting slot 27 is not the limiting factor. In this way the transverse optical mode 32 is well defined and not dependent on subtle effects such as thermally induced index shifts which often vary with bias current.

Figure 8:
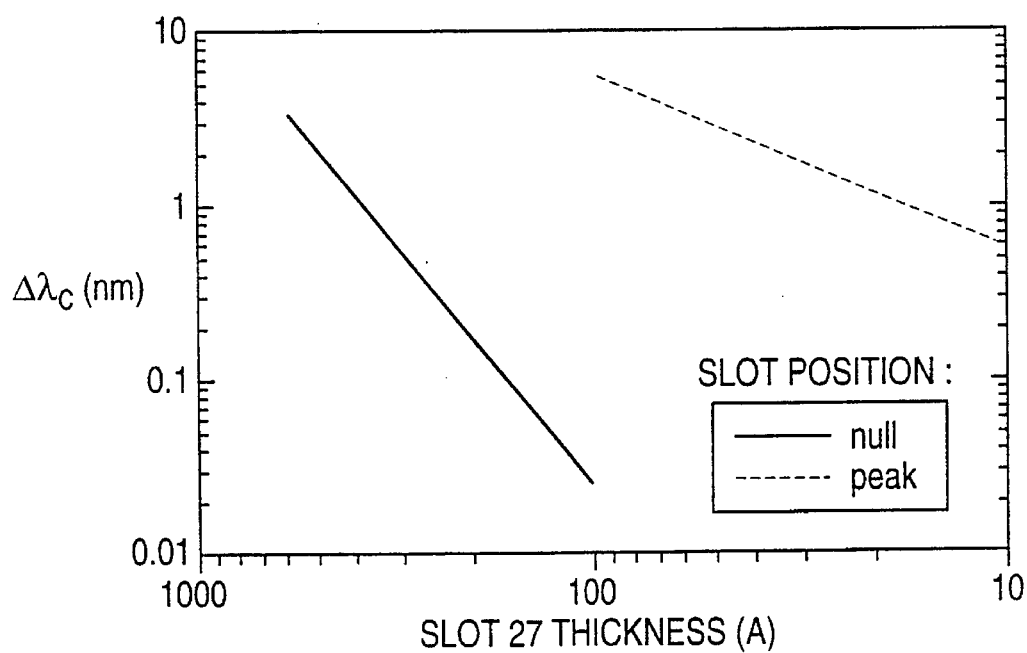
FIG. 8 is a plot of the shifts in axial cavity-mode resonance for varying insulating-slot thickness. One curve is for the slot centered on an axial standing-wave null, the other for the slot centered on an axial standing-wave peak.

From an optics point of view, it is desirable to make the slot 27 as thin as possible. From an electrical and technological point of view, thicker slots have higher breakdown voltages and are easier to fabricate. By placing the slot 27 near an axial-mode standing-wave null, thicker slots can be used. FIG. 8 shows an example of the shift in cavity mode resonance $\Delta\lambda_c$ for a VCSEL designed for operation at $\lambda_c=1000$ nm where an AlAs layer is converted into an air slot by selective etching. Two curves are shown, one with the slot centered on an axial standing-wave null as in FIG. 5 and the other where the slot is centered on an axial standing-wave peak. In both curves the slot 27 is placed in an $Al_{0.5}Ga_{0.5}As$ cavity between 15 period distributed Bragg reflectors of alternating AlAs and GaAs layers. Only the position within the cavity is changed. The preferred design of $\Delta\lambda_c \leq 0.5$ nm requires a slot thickness of 300 Å or less if placed at a null but requires a slot thickness of 10 Å or less if placed at a peak. It is therefore much easier to realize constricted current confinement without constricting the transverse optical mode if the electrically-insulating slot 27 is placed near an axial standing-wave null.

Figure 9:
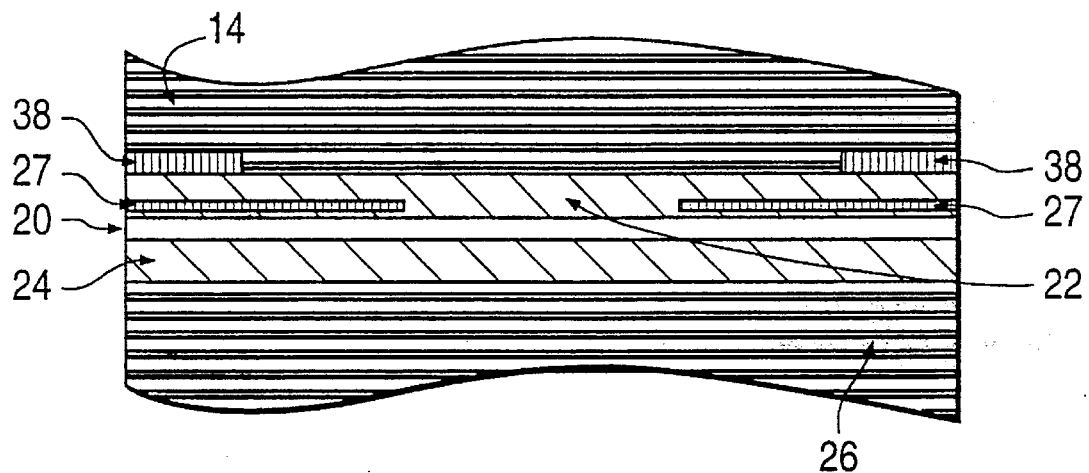
FIG. 9 is a side cross-sectional view of a detail of another VCSEL according to the invention, using a thick slot to confine the mode and a thin slot to confine the current.
Figure 10:
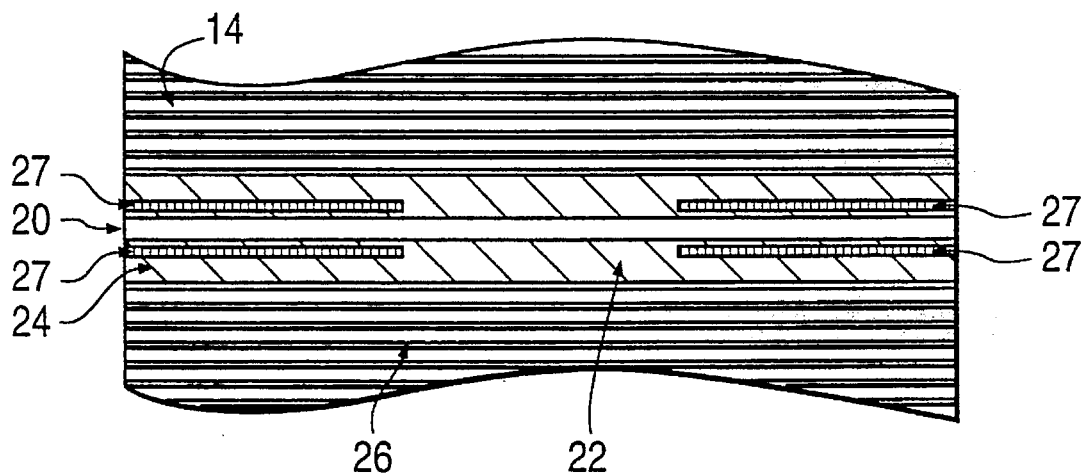
FIG. 10 is a side cross-sectional view of a detail of another VCSEL according to the invention, showing a pair of thin insulating slots on either side of the active region.
Figure 11:
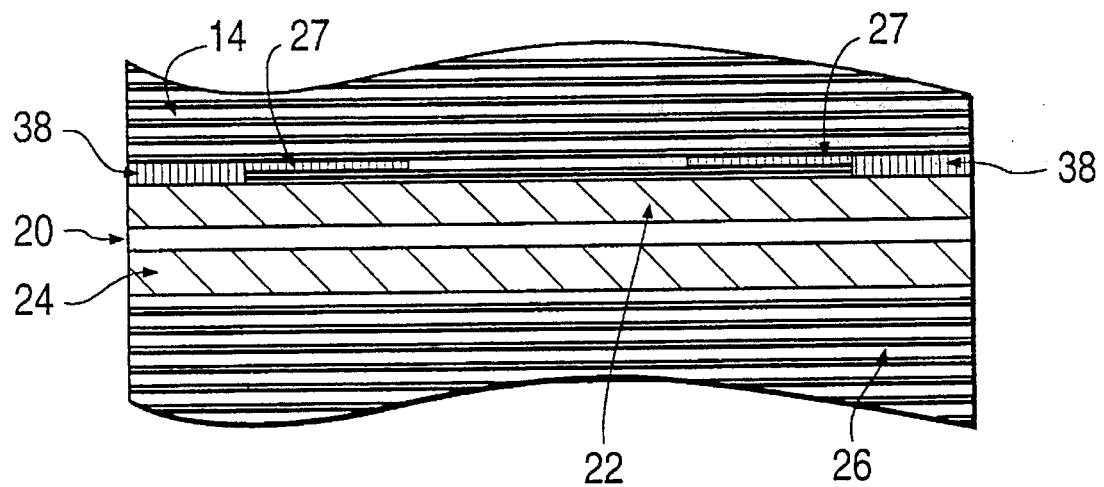
FIG. 11 is a side cross-sectional view of a detail of another VCSEL according to the invention, showing the thin slot combined with the thick slot.

The detailed design shown in FIGS. 5–8 was used as an example to illustrate the effective implementation of the invention. The exact slot thicknesses and limitations will be different for the various material systems and lasing wavelengths but the principles and design technique remains the same. Many different embodiments are possible. FIG. 9 is a side cross-sectional view of a detail of another VCSEL according to the invention, combining a thick electrically-insulating slot 38 defining a larger diameter constriction and a thin electrically-insulating slot 27 defining a smaller diameter constriction. The thick slot 38 results in a large axial cavity mode shift and thus confines the transverse optical mode 32 while the thin slot 27 only constricts the current 30. This configuration has the advantage of a well defined mode diameter with more efficient, single transverse-mode operation. FIG. 10 is a side cross-sectional view of a detail of another VCSEL according to the invention, showing a pair of thin insulating slots 27. Such a configuration has the advantage of minimizing outward carrier diffusion by constricting both electrons and hole injection into the active region 20. FIG. 11 is a side cross-sectional view of a detail of another VCSEL according to the invention, showing a thin slot 27 combined with a thick slot 38. This design has the same advantages as the embodiment of FIG. 9 but can be easier to fabricate. Many selective techniques such as wet etching or wet oxidation become slow as the layer thickness becomes thin due to reactant transport limitations. By combining the thin slot 27 with the thick slot 38, the thin slot need only extend 1–3 microns beyond the thick slot edge. The combined slot embodiment shown in FIG. 11 thus removes reactant transport limits and facilitates the application of the selective techniques to mesas which are 10's of μm in diameter or more. As can be seen in FIG. 5, the axial mode's standing wave has a null at the outer edges of the low index layers comprising the mirror stacks. One particularly convenient arrangement, then, is to use the first low-index layer 36, within the mirror stack 14 or 26, for the thick slot 38 and place the thin slot 27 on the edge away from the active region 20. The thick slot 38 could be formed by making the first low-index layer 36 from $Al_yGa_{1-y}As$ and the thin slot 27 from $Al_zGa_{1-z}As$ where $z > y$ and where the remaining exposed low-index layers within mirror stacks 14 or 26 are made from $Al_xGa_{1-x}As$ where $y > x$. The wet etch or oxidization rates increase with increasing aluminum content as is known in the art. The selectivity or variation in rate with aluminum content can be quite strong, and thus small deviations from design or lot to lot can significantly affect the process control. It can be preferable, then, to generate effective alloys using digital superlattices of binary or ternary materials for repeatable results.

Figure 12:
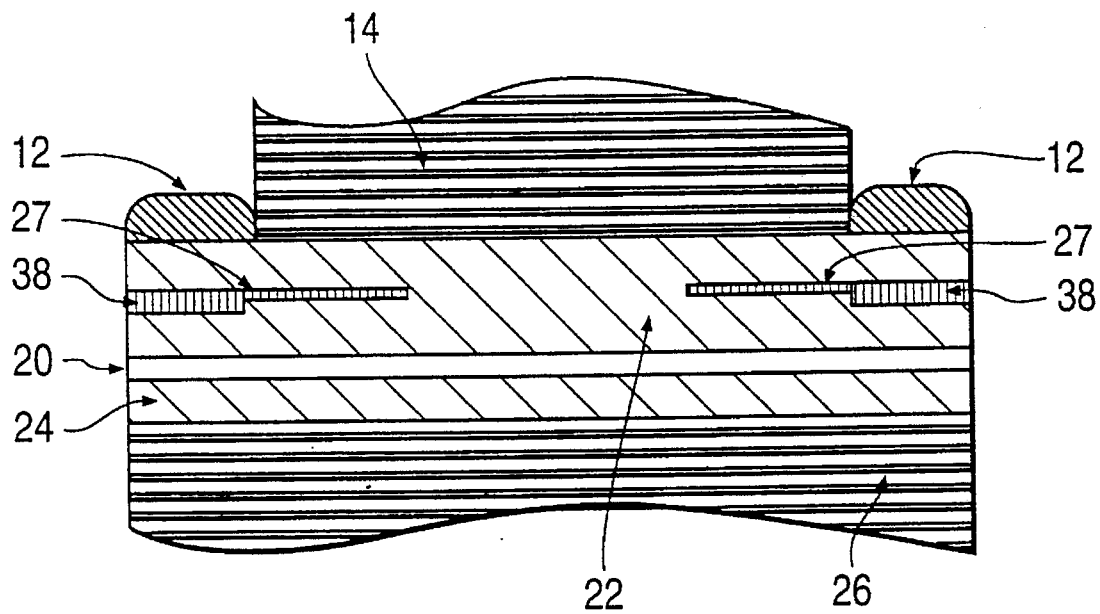
FIG. 12 is a side cross-sectional view of a detail of another VCSEL according to the invention, showing the thin slot combined with the thick slot and the use of an intra-cavity contact.

FIG. 12 is a side cross-sectional view of a detail of another VCSEL according to the invention, using a combined thick slot 38 and thin slot 27 placed within the first contacting layer 22. An annular-like first electrode 12 has been placed in contact with the first contacting layer 22. The first contacting layer 22 has been thickened to allow placement of the slots 27 and 38 in the proper location as shown for the low index layer 36 in FIG. 5. The structure shown in FIG. 12 has the advantage of allowing insulating materials to be used for the first mirror stack 14. Other possible embodiments use several periods of conducting mirror layers and then an annular like electrode 12.

Figure 13:
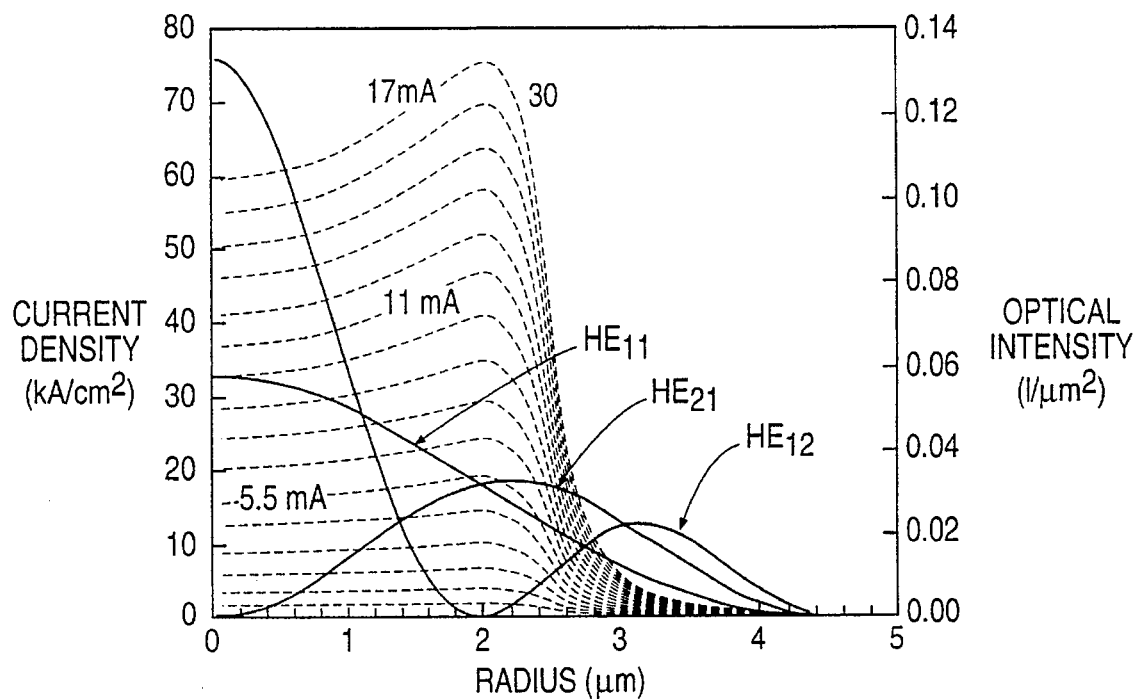
FIG. 13 shows calculated current injection profiles into the active region and three transverse optical modes.

For effective implementation of the invention, one must also consider the effects of current crowding and current spreading. Current crowding occurs around the edge of the electrically-insulating slot 27 because the current 30 finds the path of least resistance between the first electrode 12 and the second electrode 16. Because the current constriction is smaller than the contact diameters, the current will tend to crowd at the edges, particularly at higher bias currents when the junction resistance is low. Current spreading occurs as the current spreads outward between the electrically insulating slot 27 and the active region 20. Because the active region voltage drop is proportional to the current density, a lower voltage drop and hence lower resistance is encountered when the current passes through a larger active region area. This current spreading effect is particularly important at low biases, such as at lasing threshold, when the diode resistance is high. As disclosed in U.S. Pat. No. 5,343,487, the current crowding effect can be minimized by introducing a resistive layer between the current constricting slot 27 and the active region 20. Current spreading is of great concern in achieving low threshold lasing operation. Current spreading can also be reduced by increasing the sheet resistance of the material between the current constricting slot 27 and the active region 20. The sheet resistance is increased by reducing the material thickness between the slot 27 and the active region 20. The sheet resistance is also increased by reducing the mobility or concentration of carriers in the material between the slot 27 and the active region 20. Referring to FIG. 13, the calculated current density profiles 32 injected into the active region 20 for a range of bias currents are shown. The calculations are for a structure similar to FIG. 12 and are described in greater detail in the Appendix. The dashed lines show the current density profiles injected into the active region 20 assuming a current constriction diameter of 5 µm. Several current biases, found by integrating the current density profiles over the active region, are indicated for a sense of scale. One can see a significant fraction of the current spreading outward at the low bias levels representative of the lasing threshold current. At higher biases, one can see the current begin to crowd around the current constriction, peaking at the edge and showing lower injection levels in the center. Also shown in FIG. 13 are three transverse optical modes defined by a large index discontinuity at a diameter of 9 µm. The fundamental transverse optical mode, the $HE_{11}$ mode, has the best optical overlap with the injected current and thus the laser will operate with a single transverse mode and with increased efficiency compared with prior art which have the transverse optical mode 32 and the diameter of current flow 30 coincident.

Figure 14:
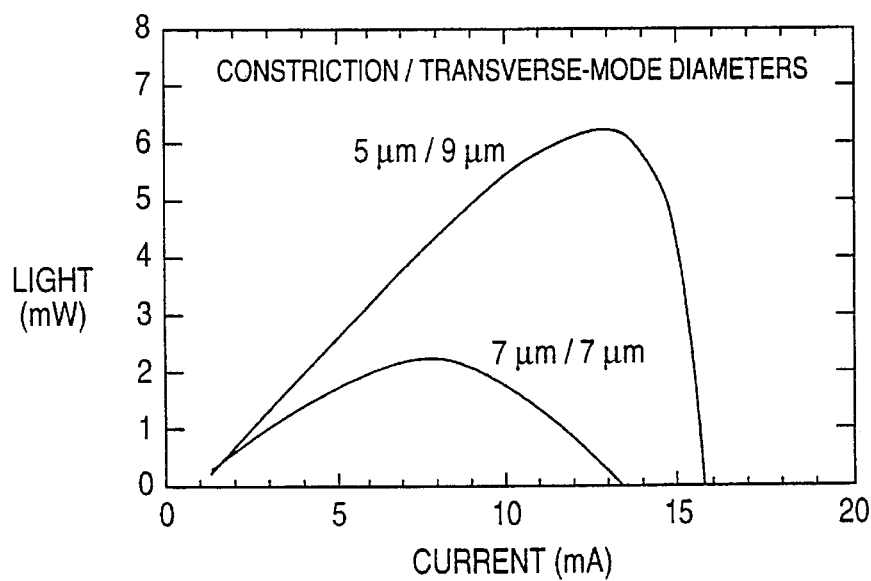
FIG. 14 shows the calculated current-to-light characteristics for two VCSELs showing the improved efficiency of the design according to the invention.
Figure 15:
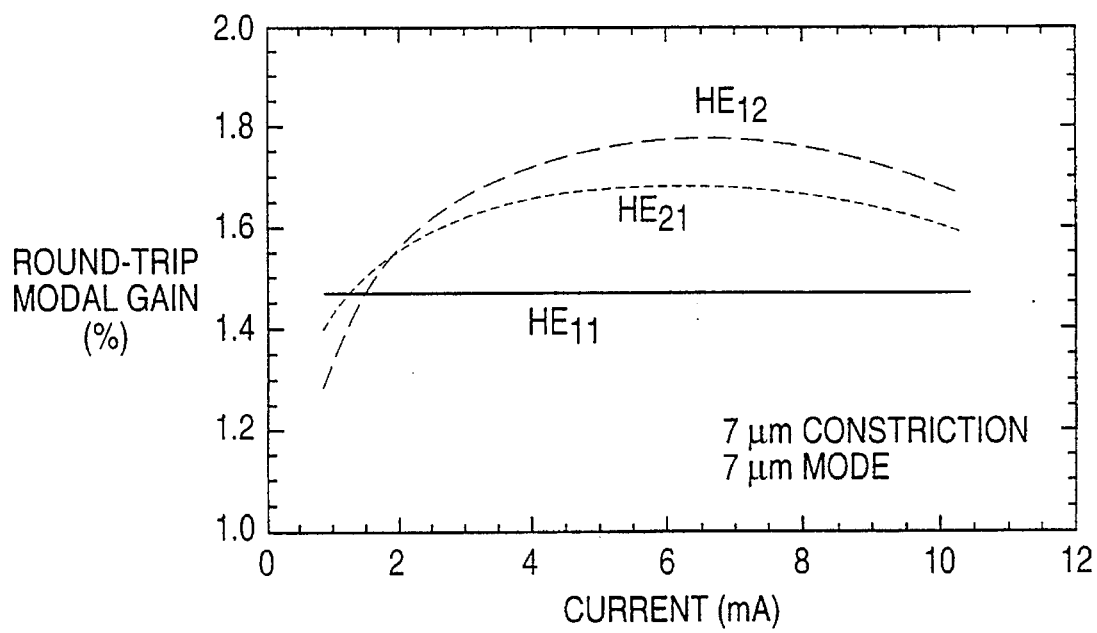
FIG. 15 and 16 shows the modal gain of the three transverse modes shown FIG. 13 for the two calculated lasing characteristics in FIG. 14.
Figure 16:
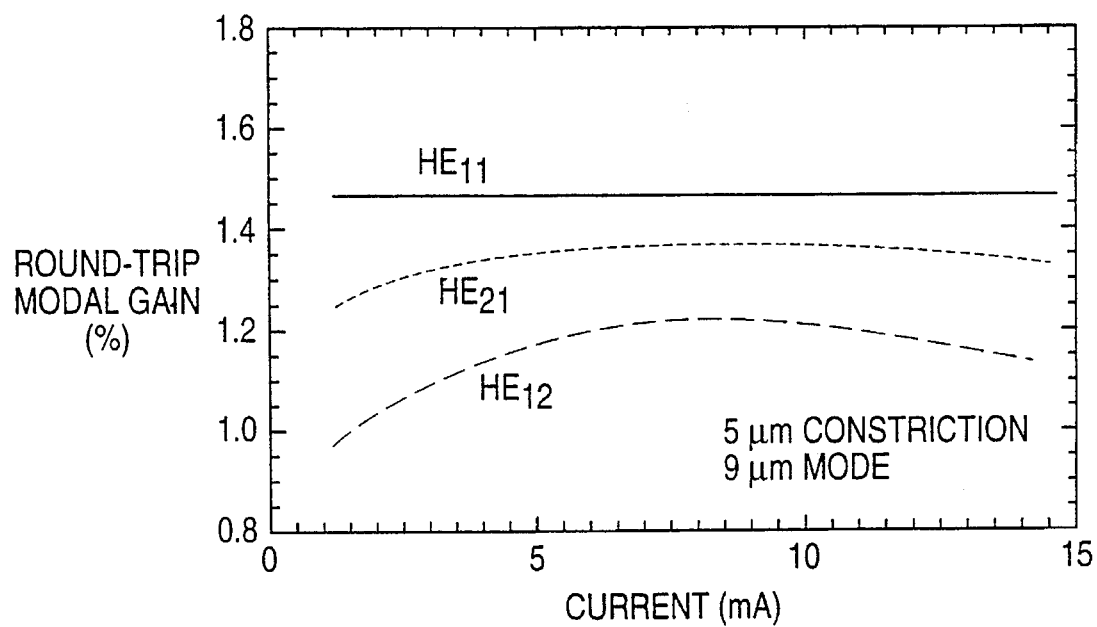

A laser according to the invention is compared with prior art lasers in FIGS. 14–16. Referring to FIG. 14, the calculated current-to-light characteristics are shown for two VCSELs. All structural properties are identical for the two calculations except the current constriction and transverse mode diameters. The laser representative of prior art has a 7 µm diameter current constriction and optical mode. The laser according to the invention has a 5 µm diameter current constriction defined by a thin slot 27 and a 9 µm diameter mode defined by a thick slot 38. The current-to-light characteristics of the laser according to the invention show improved efficiency and improved linearity due to the improved optical overlap with the current 32 as shown in FIG. 13. Improved efficiency and linearity are important benefits, particularly in analog communications applications.

Greater insight into the stabilization of the transverse optical mode by the invention is gained upon reference to FIGS. 15 and 16. Both current-to-light calculations shown in FIG. 14 assume that only the fundamental transverse mode, the $HE_{11}$ mode, is lasing. There are a number of other higher-order transverse modes which are well represented by the $HE_{21}$ and $HE_{12}$ modes shown in FIG. 13. It is desirable for many applications that the laser emit the optical power in a single transverse optical mode. Such applications include laser printing, single mode fiber optic communication and sensors. During the course of the current-to-light curve, the carrier densities in prior art devices rises at the edge of the optical mode due to the weak mode intensity. The rising carrier density at the periphery results in higher gain for the higher-order transverse modes and generally results in laser operation with multiple lateral modes. Such undesirable multimode operation can be avoided by the use of the invention. FIGS. 15 and 16 show the round-trip modal gain for each of the three transverse optical modes during the course of the current-to-light curve of the prior art and laser according to the invention respectively. The gain of the lasing $HE_{11}$ mode is constant as is required. Referring to FIG. 15, the round-trip modal gain for the higher-order modes rise due to spatial hole burning. Higher optical losses for the higher-order modes make their threshold gain somewhat above the fundamental's threshold gain of 1.53%. Without excessive additional optical losses, however, the laser would be expected to have multimode operation at higher bias levels. This is the behavior observed for prior art VCSELs. Referring to FIG. 16, the round-trip gain of the higher-order transverse modes never exceed that of the fundamental, ensuring single transverse-mode operation. Such stabilized single mode operation is a direct consequence of constricting the current 30 to a diameter significantly less than the transverse optical mode 30, thereby eliminating spatial hole burning effects.

In the above examples cylindrical geometry was assumed and the specific calculations were for an AlGaAs VCSEL comprising InGaAs quantum wells in the active region 20. The physical principles underlying the invention are very general and are equally applicable to other geometries and material systems including square or rectangular constrictions and phosphide and nitride based semiconductors. The invention is applicable to VCSELs emitting in the infrared, visible and ultraviolet wavelengths. The invention is applicable not only to electrically-pumped but also to optically-pumped VCSELs. The structure shown in FIG. 10 is particularly useful for optically pumped VCSELs, as both electrons and holes can be generated on either side of the active region 20. The embodiment can be extended to optically pumped VCSELs with multiple active regions by placing pairs of slots 27 around each active region 20.

The invention has now been explained with reference to specific embodiments. Other embodiments will be apparent to those of ordinary skill in the art upon reference to this disclosure. It is therefore not intended that this invention be limited, except as indicated by the appended claims.

What is claimed is:

1. A vertical-cavity surface emitting laser device (VCSEL) comprising:

an active region;

first and second mirror stacks forming a resonant cavity, said first mirror stack placed above said active region and said second mirror stack placed below said active region, at least one of which allows the partial emission of the laser light;

first and second electrodes disposed so as to cause a current flow through said active region;

a first contacting region and a second contacting region on each of a first and second side of said active region in electrical contact with said respective first electrode and said second electrode, each one of said contacting regions providing a current path for distributing current through the active region; and a thin dielectric slot forming a current aperature that is non-conductive placed above said active region for guiding current flowing through the active region to an area near the center of the active region, said slot being sufficiently thin so as not to constrict a fundamental optical mode of said VCSEL.

2. The device according to claim I wherein the current aperature formed by said slot is less than the $(1/e)^2$ diameter of the transverse optical mode thereby improving device efficiency.

3. The device according to claim 1 wherein the current aperature formed by said slot is less than the $(1/e)$ diameter of the transverse optical mode thereby improving device efficiency and ensuring single mode operation.

4. The device according to claim 1 wherein said slot has been placed near an axial standing wave null in said resonant cavity.

5. The device according to claim 2 wherein said slot has been placed near an axial standing wave null in said resonant cavity.

6. The device according to claim 3 wherein said slot is placed near an axial standing wave null in said resonant cavity.

7. The device according to claim 1 further comprising multiple dielectric slots.

8. The device according to claim 2 further comprising multiple dielectric slots.

9. The device according to claim 3 further comprising multiple dielectric slots.

10. The device according to claim 1 wherein said slot comprises a thin part forming a narrow aperture and not constricting the optical mode and a thick part forming a wider aperture which defines the transverse optical mode.

11. A vertical-cavity surface emitting laser device (VCSEL) comprising:

an active region;

first and second mirror stacks forming a resonant cavity, said first mirror stack placed above said active region and having one surface through which laser light may be emitted and said second mirror stack placed below said active region;

firsthand second electrodes disposed so as to cause a current flow through said active region;

a first contacting region and a second contacting region on each of a first and second side of said active region in electrical contact with said respective first electrode and said second electrode, each one of said contacting regions providing a current path for distributing current through the active region; and a thin dielectric insulating slot formed in said first contacting region forming a current aperature for guiding current flowing through the active region to an area near the center of the active region, said slot being sufficiently thin so as not to constrict a fundamental optical mode of said VCSEL.

12. The device according to claim 11 further comprising a second dielectric insulating slot above said first slot, said second slot being thicker than said first slot in order to more effectively block current and said second slot extending less towards a center of said VCSEL cavity than said first slot so as to not interfere with the optical mode of said VCSEL.

13. The device according to claim 11 further comprising a second thin dielectric insulating slot below said active region so to include two current aperatures.

14. The device according to claim 11 wherein said thin slot is an extension of a thicker slot, said thicker slot extending towards a center of said VCSEL cavity and defining a larger constriction than said thin slot, said thin slot extending further towards a center of said VCSEL cavity than said thick slot wherein the thick slot confines the transverse optical mode and the current while the thin slot constricts the current only.

15. The device according to claim 14 wherein said thin slot is placed near an axial standing wave null in said resonant cavity.

16. The device according to claim 14 wherein said thin slot is manufactured subsequent to said thick slot using a selective techniques whereby said manufacturing is facilitated because said thin slot need extend only a small distance from the end of said thick slot.

17. The device according to claim 11 wherein an axial mode is defined by the spacing of the reflective surfaces of the said first and second mirror stacks and by the thicknesses of said active region and said first and second contacting layers and wherein said active region is placed at a maximum in the axial mode's standing wave pattern.

18. The device according to claim 11 wherein one of said first and second contacting layers is a p-type contacting layer and the other is an n-type contacting layer and wherein said slot is placed on the p-type layer side of the active region so as to restrict hole current flow.

19. The device according to claim 11 wherein a larger-diameter index discontinuity is used to define the transverse optical mode and the equation $$\frac{\Delta n}{n_{\mathit{eff}}} = \frac{\Delta \lambda_c}{\lambda_c}$$

is used to ensure that the slot is not the limiting factor.

20. The device according to claim 11 wherein said slot is placed at an axial mode standing wave null and has a thickness between 250 and 350 Å.

21. The device according to claim 11 wherein said thick slot is formed within a first low-index of one of said mirror stacks and said thin slot is placed on the edge of said thick slot away from said active region.

22. The device according to claim 21 wherein said thick slot is formed by making said first low-index layer from $Al_yGa_{1-y}As$ and said thin slot 27 is formed from $Al_zGa_{1-z}As$ where z>y and where the remaining exposed low-index layers within said mirror stacks are made from $Al_xGa_{1-x}As$ where y>x.

23. The device according to claim 11 wherein a combined thick slot and thin slot are placed within said first contacting layer and wherein said first electrode is an annular-like electrode placed in contact with said first contacting layer and said first contacting layer is thickened to allow placement of the combined slots in the proper location for the low index layer allowing insulating materials to be used for the first mirror stack.

24. The device according to claim 11 further comprising a nonlinear increasing resistivity profile in at least one of said contacting regions between said active region and said slot where said increasing resistivity is such that the resistivity adjacent to said active region is at least one order of magnitude greater than the resistivity in contact with said first or second electrode to minimize current crowding at perimeter edges of said active region.

* * * * *